United States Patent
Schwartz et al.

(10) Patent No.: US 8,502,200 B2
(45) Date of Patent: Aug. 6, 2013

(54) ELECTROLUMINESCENT LIGHT-EMITTING DEVICE COMPRISING AN ARRANGEMENT OF ORGANIC LAYERS, AND METHOD FOR ITS PRODUCTION

(75) Inventors: Gregor Schwartz, Dresden (DE); Kentaro Harada, Dresden (DE); Karsten Walzer, Dresden (DE); Martin Pfeiffer, Dresden (DE); Karl Leo, Dresden (DE)

(73) Assignee: Novaled AG, Dresden (DE)

( * ) Notice: Subject to any disclaimer, the term of this patent is extended or adjusted under 35 U.S.C. 154(b) by 685 days.

(21) Appl. No.: 12/160,503

(22) PCT Filed: Jan. 11, 2007

(86) PCT No.: PCT/EP2007/000211
§ 371 (c)(1),
(2), (4) Date: Aug. 26, 2010

(87) PCT Pub. No.: WO2007/082674
PCT Pub. Date: Jul. 26, 2007

(65) Prior Publication Data
US 2011/0186864 A1 Aug. 4, 2011

(30) Foreign Application Priority Data
Jan. 11, 2006 (EP) .................................... 06000436

(51) Int. Cl.
*H01L 35/24* (2006.01)

(52) U.S. Cl.
USPC ........................ 257/40; 257/88; 257/E51.001

(58) Field of Classification Search
USPC ....................... 257/40, 88, E51.001
See application file for complete search history.

(56) References Cited

U.S. PATENT DOCUMENTS

| 4,356,429 A | 10/1982 | Tang |
| 4,769,292 A | 9/1988 | Tang et al. |
| 5,093,698 A | 3/1992 | Egusa |
| 5,500,537 A | 3/1996 | Tsumura et al. |
| 5,703,436 A | 12/1997 | Forrest et al. |
| 5,757,026 A | 5/1998 | Forrest et al. |
| 5,811,833 A | 9/1998 | Thompson |

(Continued)

FOREIGN PATENT DOCUMENTS

| CA | 2549309 | 9/2005 |
| DE | 19916745 | 10/2000 |

(Continued)

OTHER PUBLICATIONS

Gu et al., "Transparent Stacked Organic Light Emitting Devices. I. Design Principles and Transparent Compound Electrodes", Journal of Applied Physics, vol. 86, No. 8, Oct. 15, 1999, pp. 4067-4075.

(Continued)

*Primary Examiner* — Anthony Ho
(74) *Attorney, Agent, or Firm* — Sutherland Asbill & Brennan LLP

(57) ABSTRACT

The invention relates to an electroluminescent light-emitting device comprising an arrangement of organic layers which are applied to a substrate, and also to a method for its production. The arrangement of organic layers comprises the following layers: at least one charge carrier transport layer consisting of organic material, and at least one light-emitting layer consisting of organic material. The arrangement of organic layers furthermore comprises at least one doped fullerene layer which has a doping that increases the electrical conductivity.

34 Claims, 4 Drawing Sheets

(56) References Cited

U.S. PATENT DOCUMENTS

| | | |
|---|---|---|
| 5,840,217 A | 11/1998 | Lupo et al. |
| 5,917,280 A | 6/1999 | Burrows et al. |
| 5,969,474 A | 10/1999 | Aria |
| 5,989,785 A | 11/1999 | Ishihara et al. |
| 6,023,073 A | 2/2000 | Strite |
| 6,107,734 A | 8/2000 | Tanaka et al. |
| 6,274,980 B1 | 8/2001 | Burrows et al. |
| 6,303,238 B1 | 10/2001 | Thompson et al. |
| 6,310,360 B1 | 10/2001 | Forrest et al. |
| 6,337,492 B1 | 1/2002 | Jones et al. |
| 6,406,804 B1 | 6/2002 | Higashi |
| 6,437,769 B1 | 8/2002 | Kohayashi |
| 6,555,840 B1 | 4/2003 | Hudson et al. |
| 6,566,807 B1 | 5/2003 | Fujita et al. |
| 6,573,651 B2 | 6/2003 | Adachi et al. |
| 6,579,422 B1 | 6/2003 | Kasinuma |
| 6,580,027 B2 | 6/2003 | Forrest et al. |
| 6,589,673 B1 | 7/2003 | Kido et al. |
| 6,639,357 B1 | 10/2003 | Parthasarathy et al. |
| 6,645,645 B1 | 11/2003 | Adachi et al. |
| 6,720,573 B2 | 4/2004 | Son |
| 6,734,457 B2 | 5/2004 | Yamazaki |
| 6,835,470 B1 | 12/2004 | Magain |
| 6,867,538 B2 | 3/2005 | Adachi et al. |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,911,666 B2 | 6/2005 | Voutsas |
| 6,933,522 B2 | 8/2005 | Lin |
| 6,936,961 B2 | 8/2005 | Liao et al. |
| 6,965,197 B2 | 11/2005 | Tyan |
| 6,979,414 B2 | 12/2005 | Hosokawa et al. |
| 7,001,536 B2 | 2/2006 | Thompson et al. |
| 7,074,500 B2 | 7/2006 | Pfeiffer |
| 7,161,292 B2 | 1/2007 | Leo |
| 7,301,167 B2 | 11/2007 | Ko |
| 7,473,410 B1 | 1/2009 | Huffman et al. |
| 7,528,541 B2 | 5/2009 | Kasama et al. |
| 2001/0033136 A1 | 10/2001 | Kawase |
| 2002/0030440 A1 | 3/2002 | Yamazaki |
| 2002/0041975 A1 | 4/2002 | Ueda et al. |
| 2002/0048688 A1 | 4/2002 | Fukuoka et al. |
| 2002/0071082 A1 | 6/2002 | Hiroyuki et al. |
| 2002/0084993 A1 | 7/2002 | Taneya et al. |
| 2002/0098379 A1 | 7/2002 | Arakane et al. |
| 2002/0109136 A1 | 8/2002 | Seo et al. |
| 2003/0020073 A1 | 1/2003 | Long et al. |
| 2003/0042848 A1 | 3/2003 | Park et al. |
| 2003/0052616 A1 | 3/2003 | Antoniadis et al. |
| 2003/0098946 A1 | 5/2003 | Blaessing et al. |
| 2003/0127973 A1 | 7/2003 | Weaver et al. |
| 2003/0146443 A1 | 8/2003 | Tokuda et al. |
| 2003/0170491 A1 | 9/2003 | Liao et al. |
| 2003/0178619 A1 | 9/2003 | Forrest et al. |
| 2003/0189401 A1 | 10/2003 | Kido et al. |
| 2003/0230980 A1 | 12/2003 | Forrest et al. |
| 2004/0012980 A1 | 1/2004 | Sigiura et al. |
| 2004/0032220 A1 | 2/2004 | Cok et al. |
| 2004/0062949 A1 | 4/2004 | Pfeiffer et al. |
| 2004/0067324 A1 | 4/2004 | Lazarev et al. |
| 2004/0104394 A1 | 6/2004 | Lin et al. |
| 2004/0113547 A1 | 6/2004 | Son |
| 2004/0119400 A1 | 6/2004 | Takahashi et al. |
| 2004/0150330 A1 | 8/2004 | Suh et al. |
| 2004/0183067 A1 | 9/2004 | Strip et al. |
| 2004/0191952 A1 | 9/2004 | Shtein et al. |
| 2004/0201018 A1 | 10/2004 | Yamahara et al. |
| 2004/0214041 A1 | 10/2004 | Lu et al. |
| 2004/0227460 A1 | 11/2004 | Liao et al. |
| 2004/0235209 A1 | 11/2004 | Hasegawa et al. |
| 2004/0251816 A1 | 12/2004 | Leo et al. |
| 2005/0029933 A1 | 2/2005 | Liao et al. |
| 2005/0040390 A1 | 2/2005 | Pfeiffer et al. |
| 2005/0040392 A1 | 2/2005 | Wu et al. |
| 2005/0053801 A1 | 3/2005 | Elschner et al. |
| 2005/0061232 A1 | 3/2005 | Werner et al. |
| 2005/0073251 A1 | 4/2005 | Kato |
| 2005/0086251 A1 | 4/2005 | Hatscher et al. |
| 2005/0095736 A1 | 5/2005 | Padiyath et al. |
| 2005/0098207 A1 | 5/2005 | Matsumoto et al. |
| 2005/0110009 A1 | 5/2005 | Blochwitz-Nimoth et al. |
| 2005/0118745 A1 | 6/2005 | Yamazaki |
| 2005/0173700 A1 | 8/2005 | Liao et al. |
| 2005/0189875 A1 | 9/2005 | Nakada |
| 2005/0218797 A1 | 10/2005 | Bechtel et al. |
| 2005/0255334 A1 | 11/2005 | Kang et al. |
| 2005/0269943 A1 | 12/2005 | Hack et al. |
| 2005/0270279 A1 | 12/2005 | Giraldo et al. |
| 2006/0033115 A1 | 2/2006 | Blochwitz et al. |
| 2006/0038170 A1 | 2/2006 | Brunschwiler et al. |
| 2006/0061266 A1 | 3/2006 | Kang et al. |
| 2006/0065904 A1 | 3/2006 | Uemura et al. |
| 2006/0105200 A1 | 5/2006 | Poplavskyy et al. |
| 2006/0145365 A1 | 7/2006 | Halls et al. |
| 2006/0157728 A1 | 7/2006 | Iuo |
| 2006/0202196 A1 | 9/2006 | Kawakami et al. |
| 2006/0231843 A1 | 10/2006 | Qin et al. |
| 2006/0232992 A1 | 10/2006 | Bertram et al. |
| 2006/0238112 A1 | 10/2006 | Kasama et al. |
| 2006/0250076 A1 | 11/2006 | Hofmann et al. |
| 2006/0251922 A1 | 11/2006 | Lio |
| 2006/0273310 A1 | 12/2006 | Birnstock et al. |
| 2007/0034860 A1 | 2/2007 | Nakamura et al. |
| 2007/0051946 A1 | 3/2007 | Walzer et al. |
| 2007/0278479 A1 | 12/2007 | Werner et al. |
| 2008/0143250 A1 | 6/2008 | Blochwitz-Nimoth et al. |
| 2008/0164807 A1 | 7/2008 | Hofmann et al. |
| 2008/0203406 A1 | 8/2008 | He et al. |
| 2009/0009071 A1 | 1/2009 | Murano et al. |
| 2009/0009072 A1 | 1/2009 | Wellmann et al. |

FOREIGN PATENT DOCUMENTS

| | | |
|---|---|---|
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| JP | 2006-156997 A | 6/2006 |
| JP | 2007-043104 A | 2/2007 |
| KR | 0522687 | 10/2005 |
| TW | 200401017 | 1/2004 |
| WO | 9204279 | 3/1992 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | 2004097954 | 11/2004 |
| WO | WO 2005/008801 | 1/2005 |
| WO | 2005086251 | 9/2005 |
| WO | WO 2005/089288 | 9/2005 |
| WO | WO 2005/109542 A1 | 11/2005 |

OTHER PUBLICATIONS

Werner et al., "n-Type Doping of Organic Thin Films Using Cationic Dyes", Advanced Functional Materials (2004), vol. 14, No. 3, pp. 255-260.
Yuan et al., "Fullerene-Doped Hole Transport Molecular Films for Organic Light-Emitting Diodes", Applied Physics Letters 86 (2005), 3 pgs.
Tsuzuki et al., "The Effect of Fullerene Doping on Photoelectric Conversion Using Titanyl Phthalocyanine and a Perylene Pigment", Solar Energy Materials and Solar Cells (2000), pp. 1-8.
Signerski et al., "The Photovoltaic Effect in a Heterojunction of Molybdenyl Phthalocyanine and Perylene Dye", Journal of Non-Crystalline Solids (2006), pp. 4319-4324.
Pfeiffer et al., "Doped Organic Semiconductors: Physics and Application in Light Emitting Diodes", Organic Electronics, vol. 4, 2003, pp. 89-103.
Lee et al., "The Effect of C60 Doping on the Device Performance of Organic Light-Emitting Diodes", Applied Physics Letters 86 (2005), 3 pgs.
Hughes et al., "Electron-Transporting Materials for Organic Eletroluminescent and Electrophosphorescent Devices", Journal of Materials Chemistry (2005), vol. 15, pp. 94-107.
Hong et al., "Effective Hole Injection of Organic Light-Emitting Diodes by Introducing Buckminsterfullerene on the Indium Tin Oxide Anode", Applied Physics Letter 87 (2005), 3 pgs.
Day et al., "The Use of Charge Transfer Interlayers to Control Hole Injection in Molecular Organic Light Emitting Diodes", Thin Solid Films 410 (2002), pp. 159-166.
Bernanose et al., J. Chem. Phys. 1953, 50, 65 "Sur Un Nouveau Mode D'Emission Lumineuse Chez Certains Composes Organiques".
Adachi et al., "Design Concept of Molecular Materials for High-Performance OLED", in: Shinar (ed.), Organic Light-Emitting Devices, Springer New York (2003), p. 43.
Werner et al., "Pyronin B as a Donor for n-Type Doping of Organic Thin Films", Applied Physics Letters, American Institute of Physics, vol. 82, No. 25, Jun. 23, 2003, pp. 4495-4497.
Translation of Japanese Office Action mailed Mar. 6, 2012 for JP Application No. 2009-541910.
Adachi, C. et al., "Efficient electrophosphorescence using a doped ambipolar conductive molecular organic thin film," Organic Electronics 2, (2001), pp. 37-43.
Adachi, C. et al., "High-efficiency organic electrophorescent devices with tris (2-phenylpyridine) iridium doped into electron-transporting materials," App. Phys. Lett. vol. 77, No. 6, Aug. 7, 2000.
Adachi, C. et al., "Nearly 100% internal phosphorescence efficiency in an organic light emitting device," Journal of Applied Physics (2001), vol. 90:10, pp. 5048-5051.
Adachi, et al. "Electroluminescence in Organic Films with Three-Layer Structure," Japanese Journal of Applied Physics, 27, L269 (1988).
Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).
Ammermann, D. et al., "Photonic devices based on crystalline organic semiconductors for optoelectronic integrated circuits," Jps. J. Appl. Phys. Pt. 1 (1995) vol. 34, pp. 1293-1297.
Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.
Baldo, et al. "Highly efficient phosphorescent emission from organic electroluminescent devices," Nature, vol. 395, Sep. 10, 1998, pp. 151-154.
Baldo, M. A. et al., "High efficiency fluorescent organic light-emitting devices using a phosphorescent sensitizer," Nature, (2000), vol. 403, pp. 750-753.
Baldo, M. A. et al., "Transient analysis of organic electrophosphorescence: I. Transient analysis of triplet energy transfer," Physical Review B, (2000), vol. 62:16, pp. 10958-10966.
Baldo, M. A. et al., "Very high-efficiency green organic light-emitting devices based on electrophosphorescence," Applied Physics Letters, (1999), vol. 75:1, pp. 4-6.
Baldo, M. A., et al., "Transient analysis of organic electrophosphorescence II. Transient analysis of triplet-triplet annihilation," Physical Review B, (2000), vol. 62:16, pp. 10967-10977.
Baldo, M., et al., "Organic vapor phase deposition," Advanced Materials, 1998, 10, No. 18, pp. 1505-1514.
Bandyopadhyay, A, et al. "Large conductance switching and memory effects in organic molecules for data-storage applications," Appl. Phys. Lett. 82, 1215 (2003).
Bard, A. J., Faulkner, R.J., Electrochemical Methods: Fundamentals and Applications, Wiley, 2nd Ed., 2000 (Chapter 2).
Bard, A. J., Faulkner, R.J., Electrochemical Methods: Fundamentals and Applications, Wiley, 2nd Ed., 2000 (Chapter 6).
Bastard, G., "Wave mechanics applied to semiconductor heterostructures," The Editions of Physique, (1988) pp. 64-67.
Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.
Baumgartel, H. et al., "Polarographische Untersuchungen zur Konformation von 1.2.3.4.5-pentaarylimidazoliumkationen," Ber. Bunsenges (1972) 76/2, 94-100.
Birnstock, J. et al., "High Efficiency Top Emitting OLEDs on a-Si Active Matrix Backplanes with Large Aperture Ratio," OLED1: Panel, IDW '04, Dec. 8, 2004.
Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.
Blochwitz, J. et al., "Interface electronic structure of organic semiconductors with controlled doping levels," Org. Electronics 2, 97 (2001).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.
Bloom, C. J. et al., "Low work function reduced metal complexes as cathodes in organic electroluminescent devices," J. of Phyiscal Chemistry B, vol. 107, No. 13, pp. 2933-2938.
Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.
Carter, S. A. et al., "Enhanced luminance in polymer composite light emitting devices," Appl. Phys. Lett., vol. 71, pp. 1145-1147, Sep. 1997.
Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.
Colle, M. et al. "Switching and filamentary conduction in non-volatile organic memories," Organic Electronics, 7, 305-312 (Oct. 2006).
Connelly, N. G. et al., "Chemical Redox Agents for Organometallic Chemistry," Chem. Rev., 96, 877 (1996).
Cotton, F. et al., "Closed-shell molecules that ionize more readily than cesium," Science, vol. 298, No. 5600, pp. 1971-1974 (Dec. 6, 2002).
D'Andrade, B.W. et al., "Relationship between the ionization and oxidation potentials of molecular organic semiconductors," Organic Electronics 6, 2005, pp. 11-20.
D'Andrade, Brian W., "Operational stability of electrophosphorescent devices containing p and n doped transport layers," Applied Physics Letters, vol. 83, No. 19, Nov. 10, 2003, pp. 3858-3860.
D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-3, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee, et al. "Effects of hydroxyl groups in polymeric dielectrics on organic transistor performance," Applied Physics Letters, 88, 162109 (2006).

Liping, Ma et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shirota, Yasuhiko et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsiper, E.V. And Soos, Z.G.; "Charge redistribution and polarization energy of organic molecular crystals," Physical Review B; vol. 64; 195124-1.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.

Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/160,503 Submitted Herewith.

ELECTROLUMINESCENT LIGHT-EMITTING DEVICE COMPRISING AN ARRANGEMENT OF ORGANIC LAYERS, AND METHOD FOR ITS PRODUCTION

The invention relates to an electroluminescent light-emitting device comprising an arrangement of organic layers, and to a method for its production.

BACKGROUND OF THE INVENTION

The electroluminescence of organic materials has become a field of intensive research since first being discovered in 1953 (Bernanose et al., J. Chim. Phys. 1953, 50, 65). The known advantages of organic materials for producing light, such as for example low reabsorption, high quantum yields and also the possibility of adapting the emission spectrum by varying the molecular structure in a relatively simple manner, could be exploited in recent years through constant development in materials research and the implementation of new concepts for effectively injecting and transporting the charge carriers into the active emission layer of an organic light-emitting element. The first display devices based on such so-called organic light-emitting diodes have already found their way onto the market, and organic light-emitting diodes will in future be firmly established as a concept alongside liquid crystal displays and displays formed of inorganic light-emitting diodes. Another market which is open to organic light-emitting diodes due to their special property of being able to emit light over a large surface area and homogeneously into the half-space is the lighting field.

The step towards mass production increases the pressure to minimize individual cost factors of the product, costs of the raw material, or even steps in the production process. One of the main cost factors is the transparent electrode material indium tin oxide (ITO) currently used, both on account of the high demand for indium, which rarely occurs naturally on Earth and is therefore expensive, and also due to the cost-intensive process for applying ITO to the substrate by sputtering. If a transparent light-emitting diode is to be produced, i.e. if ITO is therefore also to be applied as counter-electrode to the organic layers, the production process becomes even more difficult since complicated measures are necessary in order to protect the organic layers against damage caused by the high-energy particles that occur during the sputtering process.

As an example, a highly conductive polymer layer for alternative use as an electrode is proposed in the document DE 103 35 727 A1. Such polymer layers applied in the liquid form achieve conductivities of up to 550 S/cm. This obviously solves the problem of the expensive starting material, since indium is not used. However, one disadvantage of this invention is that an additional step is still required in order to apply the polymer electrode to the substrate. Particularly for producing organic light-emitting diodes which consist of a sequence of amorphous thin layers applied by vapor deposition in vacuo, the application of the polymer electrode by spin-coating at normal pressure under simultaneously dust-free conditions complicates the production process and therefore makes it more expensive. Furthermore, it appears to be impossible to use such a method to produce transparent light-emitting diodes since, during the application of the polymer layer by spin-coating, solvents are used which generally also dissolve the underlying organic thin layers and thus unpredictably alter or even destroy the device.

One further development of transparent organic light-emitting diodes consists of stacked transparent light-emitting diodes (see for example Gu et al., J. Appl. Phys. 1999, 86, 4067). In said document, a number of transparent light-emitting diodes are applied sequentially to a substrate in a stacked manner, wherein in each case two successive light-emitting diodes have a transparent electrode in common. In order to be able to actuate the light-emitting diodes of the stack individually, transparent electrodes are guided out of the sides and contacted. To this end, a high lateral conductivity of the electrodes is required, and for this reason usually ITO is used. This leads to the same problems as mentioned above for transparent light-emitting diodes.

However, the literature to date has not yet disclosed organic layers which can be applied by vapor deposition and which have conductivities comparable to the materials applied from the liquid phase. Organic semiconductors applied by vapor deposition in general have a very low conductivity, particularly in their amorphous phase, so that, despite the effective increase in conductivity by several orders of magnitude due to doping with suitable dopants, the lateral movement of the charge carriers in a layer under vertical bias with partially non-overlapping electrodes is negligible. See in this regard FIG. 1, which shows a schematic transverse view of the described arrangement. Provided here are an electrically non-conductive substrate 1, electrodes 2, 4 which at least partially do not overlap one another, and one or more organic layers 3 in the electric field of the two electrodes 2 and 4.

For such arrangements, the conductivities reported to date for organic layers of high transparency which are applied by vapor deposition are not high enough to achieve sufficient lateral transport. Although the high intrinsic electron mobility of $C_{60}$ when doped with suitable donor-type molecules (see for example Werner et al., Adv. Func. Mater. 2004, 14, 255) may lead to high effective mobilities and conductivities (sometimes in the region of $\sigma=0.1$ S/cm), these are far from sufficient for conductive grids in the case of a resolution of approximately 100 μm which can be set for example by means of printing techniques.

Important factors for the efficiency of electroluminescent light-emitting devices are, in addition to the yield when converting electrical energy in the emission layer into light, the injection of electrons from the cathode and of holes from the anode into the respectively adjoining layer and also the capability of the individual layers for charge carrier transport. It has been found that an organic material generally does not intrinsically possess all the necessary properties, so that sometimes different materials have to be used for different functions in order to obtain an efficiently functioning component.

As hole injection and hole transport materials (Hole Transport Material—HTM), materials with work functions IP>4.5 eV and hole mobilities $\mu_h > 1 \times 10^{-5}$ cm$^2$/Vs are generally used, in order to allow good injection from the anode (ITO) and efficient transport of the holes. Examples of HTMs are phthalocyanines such as CuPc, so-called starburst molecules such as MTDATA or else benzidines such as TPD and NPD (see for example Adachi et al. (2003), "Design Concept of Molecular Materials for High-Performance OLED", in: Shinar (ed.), *Organic Light-Emitting Devices*, Springer, New York, page 43).

By contrast, the materials used as electron injection and electron transport materials (Electron Transport Material—ETM) typically have electron mobilities $\mu_e > 1 \times 10^{-6}$ cm$^2$/Vs and electron affinities EA<3.5 eV. Here, the suitable choice of EA is essentially determined by the EA of the emitter material used. Typical examples are oxadiazoles, triazoles, quinolines or thiophenes (see for example Hughes et al., J. Mater. Chem. 2005, 15, 94).

The doping of hole transport materials with acceptor-type dopants and of electron transport materials with donor-type dopants has proven to be advantageous (Pfeiffer et al., Org. Electron. 2003, 4, 89). Due to the increase in the concentration of free charge carriers in the layer which is achieved as a result, both the conductivity and the effective charge carrier mobility are improved. If a doped organic layer is used in a Schottky contact, the depletion zone becomes much thinner than in the undoped case due to the likewise increased space charge density. The injection of the charge carriers from an electrode into the transport layer can thus be significantly improved by doping the transport layer. Last but not least, this leads to a greater independence from the work function in the choice of electrode material, so that a larger selection of materials can be used as the electrode material.

Fullerenes, in particular buckminsterfullerene $C_{60}$, have also been the subject of intensive research since their discovery in 1985 and are used for example as an acceptor material in organic solar cells (see for example U.S. Pat. No. 6,580,027 B2).

A method for producing $C_{60}$ and $C_{70}$ in relatively large quantities was developed (see WO 92/04279). Since then, production methods for fullerenes have formed the subject of continuous further development, so that nowadays fullerenes are available as a very inexpensive starting material.

To date, only a few attempts have been made to use fullerenes in organic light-emitting diodes. It has been found that fullerenes in organic light-emitting diodes are not readily useful and in many cases even leads to a worsening of the properties.

For example, it has been shown (Day et al., Thin Solid Films 2002, 410, 159) that even submonolayers of $C_{60}$ between the ITO anode and the hole transport layer make injection more difficult and lead to a worsening of the component characteristics. On the other hand, in components which conduct only holes, an increase in current density at the same voltage has been found (Hong et al., Appl. Phys. Lett. 2005, 87, 063502) when a thin $C_{60}$ layer is added between the anode and the organic layer, with the authors attributing this to a surface dipole and not to a layer property of the fullerene.

Yuan et al. (Appl. Phys. Lett. 2005, 86, 143509) have found that holes can be better injected from the ITO anode into an NPB layer doped with five percent by weight of $C_{60}$ than into a pure CuPc layer. However, the injection is even better if an undoped NPB layer is used. Lee et al. (Appl. Phys. Lett. 2005, 86, 063514) show that $C_{60}$ in TDAPB acts as a weak electron acceptor, and the effective hole mobility is increased. In addition, since free electrons from leakage currents in an OLED comprising $C_{60}$:TDAPB as the hole transport layer are effectively captured by $C_{60}$ and are thus unable to destabilize the TDAPB, the service life increases for the same initial brightness.

Despite the high electron mobility $\mu_e \sim 8 \times 10^{-2}$ cm$^2$/Vs, the use of $C_{60}$ as an electron transport layer is opposed firstly by the relatively high electron affinity of ~4 eV. Lu et al. (US 2004-214041 A1) nevertheless use $C_{60}$ in conjunction with a LiF/Al cathode as an electron transport layer, with the LiF injection layer being absolutely necessary in this case. Yasuhiko et al. (PCT WO 2005-006817 A1) use separately produced Li-containing $C_{60}$ as the electron transport layer.

SUMMARY OF THE INVENTION

The object of the invention is to provide an electroluminescent light-emitting device comprising an arrangement of organic layers, and a method for its production, in which the electroluminescent light-emitting device can be produced in a cost-effective manner and by means of simplified production steps.

According to the invention, this object is achieved by an electroluminescent light-emitting device comprising an arrangement of organic layers which are applied to a substrate, the arrangement of organic layers comprising the following layers: at least one charge carrier transport layer consisting of organic material, and at least one light-emitting layer consisting of organic material, characterized in that the arrangement of organic layers comprises at least one doped fullerene layer which has a doping that increases the electrical conductivity; and by a method for producing an electroluminescent light-emitting device in which an arrangement of organic layers is applied to a substrate, the arrangement of organic layers being formed with at least one charge carrier transport layer consisting of organic material and at least one light-emitting layer consisting of organic material, characterized in that the arrangement of organic layers is formed with at least one doped fullerene layer which has a doping that increases the electrical conductivity.

The inventors have surprisingly found that conductivities of more than 2 S/cm can be achieved in an electroluminescent light-emitting device by means of doped fullerene layers, for example using fullerene $C_{60}$ and dopants, as proposed in the document WO 2005/086251 A2. Such high conductivities mean that a lateral spread of the charge carrier current in the arrangement according to FIG. 1 may be up to several hundred micrometers and more. The requirements are thus met for being able to use such an organically doped highly conductive layer as an electrode.

When forming the doped fullerene layer, one or more doping materials are incorporated in the fullerene matrix material. A layer is referred to as a p-doped layer if the matrix material contains dopants in the form of acceptors. A doped layer is referred to as an n-doped layer if the incorporated dopants for the matrix material form donors. An electrical doping in the sense of the present application results from the fact that one or more incorporated doping materials carry out a redox reaction with the matrix material, which leads to an at least partial charge transfer between the one or more doping materials on the one hand and the matrix material on the other hand, i.e. a transfer of electrical charges between the materials takes place. In this way, (additional) free charge carriers are formed in the layer, which in turn increase the electrical conductivity of the layer. A higher density of charge carriers is obtained in the matrix material compared to the undoped material. The following physical relationship exists for the electrical conductivity: charge carrier density×mobility of the charge carriers×elementary charge=electrical conductivity. The portion of the charge carriers in the matrix material which is formed by the redox reaction need not first be injected from an electrode; instead, such charge carriers are already available in the layer as a result of the electrical doping.

It may also be provided to use the doped fullerene layer as a current distribution layer for the charge carriers injected in the region of the electrode. The electric charge carriers can be transported by means of such a current distribution layer in the course of transport in the layer spread direction also into regions which, when looking at the light-emitting device from above, do not overlap with the electrode and therefore lie outside the electrode region. Such regions are obtained for example when the electrode, which may be an anode or a cathode, is provided with through-holes or openings, for example when using an electrode comprising strip-shaped elements. Between the strip-shaped elements there are gaps which are not filled with electrode material. The through-holes, which can also be referred to as cutouts, may also be formed for example as round or square through-holes or openings. The formation of the doped fullerene layer as a current distribution layer then ensures that charge carriers reach the light-emitting layer also in the region of the through-holes, so that charge carrier recombination takes place there, which in turn leads to the production of light. As an alternative to current distribution in the region of through-holes in the electrode, or in addition thereto, the current distribution layer may also serve for charge carrier transport into regions outside the electrode which are not covered in an overlapping manner by through-holes, so that these regions also contribute to light production and as a result to the lighting pattern of the device.

If the thickness of the doped fullerene layer is selected for example to be less than or not much more than 100 nm, the layer in the visible wavelength range is still sufficiently transparent. It can therefore be used as a transparent electrode in particular in electroluminescent light-emitting devices.

The doped fullerene layer is preferably applied in a high vacuum by means of simultaneous vapor deposition of the fullerene and of the organic dopant, i.e. using the method customary for organic thin layers. As a result, the application of such an electrode can be included without additional complexity in the process for producing an organic electroluminescent light-emitting device.

If electroluminescent light-emitting devices are produced with lateral dimensions of the light-emitting surface which are larger than the highly conductive doped fullerene layer can bridge by the lateral spread of the charge carrier current, a metal grid may be applied in direct contact with this doped fullerene layer. In this case, the width of the grid lines can be selected to be so small that the lines during light-emitting operation of the electroluminescent light-emitting device can no longer be perceived by the human eye. A sufficiently small ratio of the grid lines width to the spacing between the lines is approximately 1 to 10. For a distance of several hundred micrometers that can be bridged by a highly conductive doped fullerene layer, there is a line width of a few tens of micrometers. The production of metal lines with such dimensions is possible nowadays in a simple manner by vapor deposition of the metal through shadow masks. Even more advantageous are printing methods which, according to the available prior art, allow line spacings in the order of magnitude of approximately 100 micrometers.

In order to form a closed metal layer, the lines must usually have a thickness of a few tens of nanometers. A correspondingly large roughness is thus introduced for the subsequent layers, since these also have thicknesses in the range from approximately ten to one hundred nanometers. Short-circuits should therefore increasingly have occurred, but this was surprisingly not the case in our experiments.

Also surprising is the fact that, despite the unevenness introduced by the grids, a laterally homogeneously illuminating organic light-emitting diode can be applied to such an electrode. The space-charge-limited currents which usually occur in organic layers scale at $1/d^3$ (d is the layer thickness). The unevenness should therefore actually also be noticeable due to a non-homogeneously illuminating area, since the brightness is directly proportional to the flowing current. However, this cannot be seen with the naked eye, as our experiments showed. The only critical factors for the brightness distribution between the grid lines are the conductivity of the doped fullerene layer and the spacing between the lines. If the conductivity is sufficiently high and if the spacing between the lines is suitably selected, the voltage drop does not have a visible effect on the brightness between the grids.

With the stated combination of materials, fullerene, and organic dopants are materials which can be applied using the same methods as conventional thin layers in organic electroluminescent light-emitting devices. An application of the doped fullerene layer after previously applied organic thin layers is thus possible without any break in the production flow and without any measures to protect the previously applied thin layers.

Electrons from a metal with a high work function can be injected better into a fullerene layer doped with donor-type organic molecules than into a pure fullerene layer. There is therefore no need for an injection layer between the metal and the doped fullerene layer, such as LiF for example, which is disadvantageous due to the easily possible diffusion of the Li into the fullerene layer or even through the fullerene layer into adjoining layers, and also due to the generally known high reactivity of Li and the associated undesirable or non-controllable effects thereof. A fullerene layer doped with donor-type organic molecules is therefore advantageously suitable for acting as an electron transport layer in an electroluminescent light-emitting device. It is surprising here that this works despite the electron affinity, which is actually too high for customary emitter materials, as will be demonstrated in an example below.

A considerable simplification of the structure and hence of the method for producing an electroluminescent light-emitting device consists in using the doped fullerene layer both as a transparent electrode and as an electron transport layer, which equates to omitting one of the aforementioned functional layers.

In the case where the electroluminescent light-emitting device is to be operated with very high current densities, for example in order to achieve a population inversion in all of the emitter molecules present in the light-emitting layer, as is required for stimulated emission, it is advantageous to use a doped fullerene layer as a charge carrier transport material since, unlike other organic materials, this is able to carry very high current densities due to its high effective charge carrier mobility and conductivity.

DESCRIPTION OF PREFERRED EXAMPLES OF EMBODIMENTS OF THE INVENTION

The invention will be explained in more detail below on the basis of preferred examples of embodiments and with reference to the figures of a drawing, in which:

FIG. 3 shows a graph of the current density and brightness as a function of the voltage for an electroluminescent light-emitting device according to an Example 1a;

FIG. 4 shows a graph of the external quantum efficiency as a function of the brightness for the electroluminescent light-emitting device according to Example 1a;

FIG. 7 shows a graph of the current density and brightness as a function of the voltage for an electroluminescent light-emitting device according to an Example 2a; and FIG. 8 shows a graph of the external quantum efficiency as a function of the brightness for the electroluminescent light-emitting device according to Example 2a.

Advantageous embodiments according to the invention in each case include a sequence of layers:

Example of Embodiment 1

Fullerene Layer as Electrode

Figure 1:
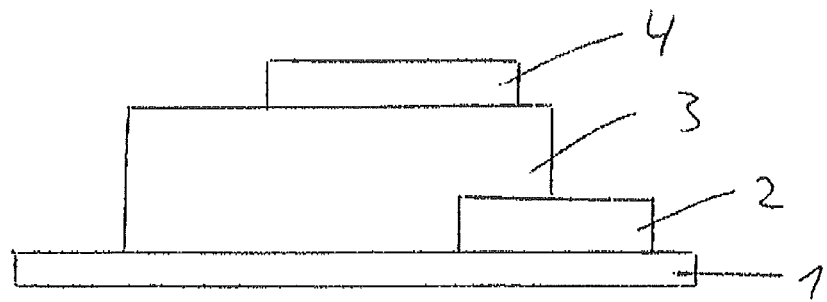
FIG. 1 shows a schematic diagram of an electroluminescent light-emitting device.
Figure 2:
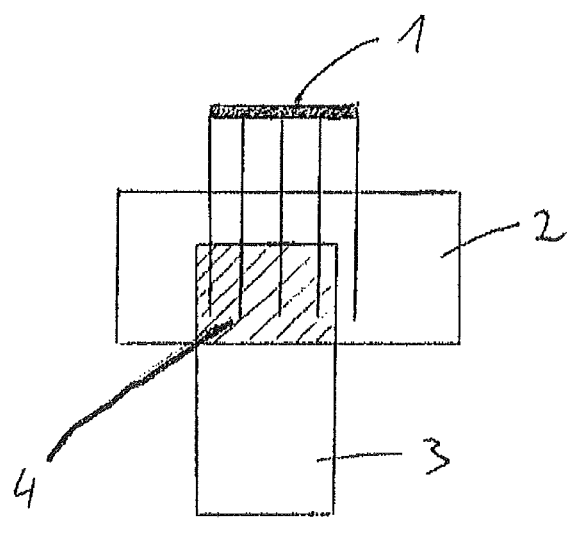
FIG. 2 shows a schematic diagram of an electroluminescent light-emitting device in plan view, in which an electrode is embodied by a fullerene layer.

1. Transparent glass substrate
2. Metal strips, spaced apart by 450 μm, width 50 μm
3. Fullerene layer doped with organic donor-type molecules
4. Non-closed gold layer, mean thickness 1 nm
5. Hole transport layer
6. Electron blocking layer
7. Light-emitting layer
8. Hole blocking layer
9. Electron transport layer
10. Aluminum cathode For illustration purposes, FIG. 2 shows a plan view of this arrangement. When a voltage is applied (plus pole to the metal strip 1, minus pole to the aluminum cathode 3), the arrangement emits light through the glass substrate. An illuminating area 4 (hatched) is determined by the lateral overlap between an aluminum electrode and a doped fullerene layer 2. If the conductivity of the doped fullerene layer 2 is greater than 0.5 S/cm, then the brightness of the illuminating area 4 appears homogeneous to the naked eye of the observer. The non-closed gold layer (4th layer of the arrangement) serves only to improve the current/voltage characteristic of the component and can be omitted without impairing the essential features of the invention.

Example 1a

Relating to Example of Embodiment 1

Figure 3:
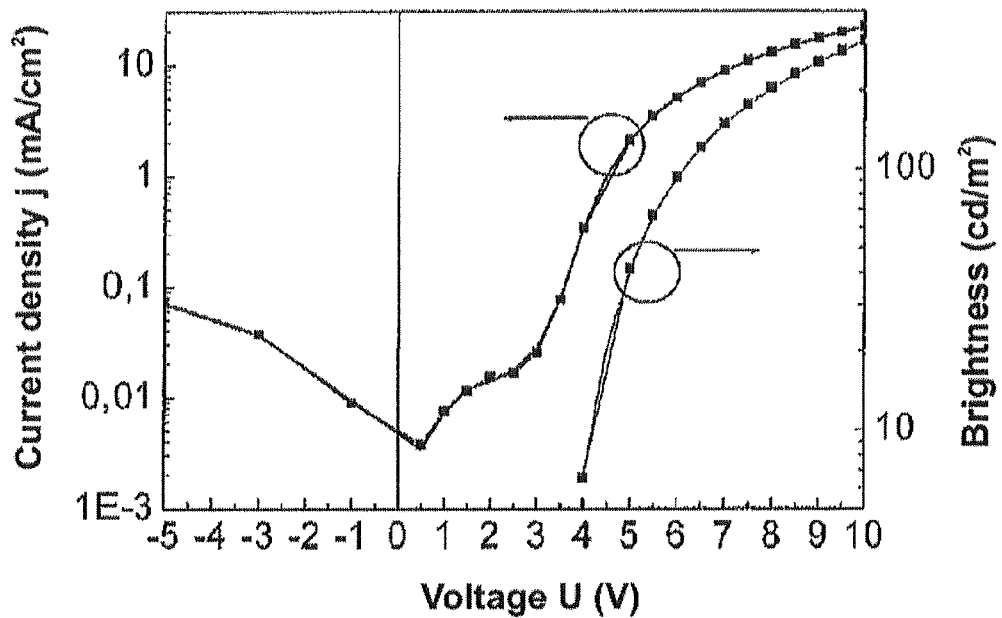
Figure 4:
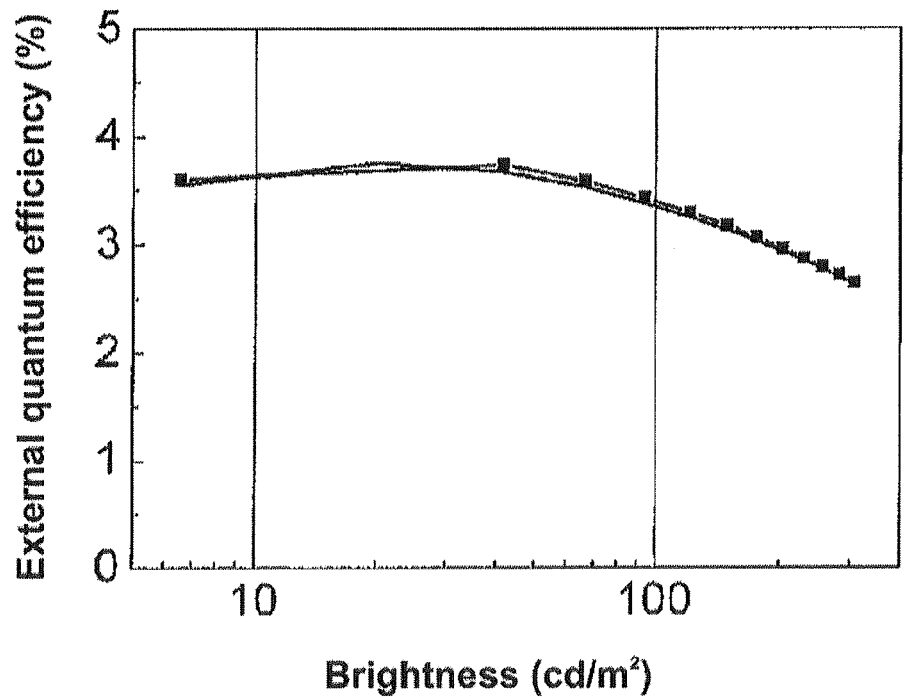
Figure 5:
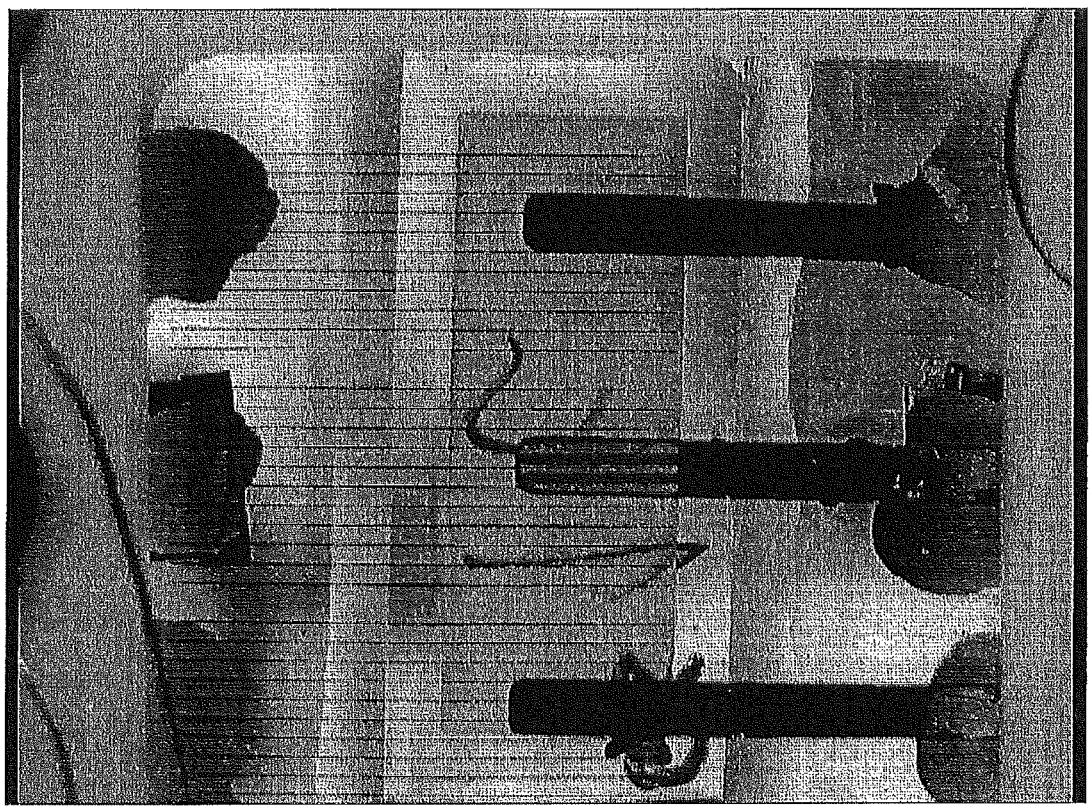
FIG. 5 shows an experimental light-emitting device.

1. Transparent glass substrate
2. Chrome strips, spaced apart by 450 μm, width 50 μm, thickness 10 nm
3. 30 nm $C_{60}$ doped with 2 mol % $[Ru(t\text{-butyl-trpy})_2]^0$
4. Nominally 1 nm of gold (not a closed layer)
5. 95 nm MeO-TPD doped with 4 mol % $F_4$-TCNQ
6. 10 nm spiro-TAD
7. 20 nm BAlq doped with 20% by weight $Ir(piq)_3$
8. 10 nm BPhen
9. 65 nm BPhen doped with Cs
10. 100 nm Al The conductivity of the layer 3. was less than 0.5 S/cm. The voltage drop between the grid lines is thus so large that a drop in brightness can also be seen in the intermediate spaces, as shown in FIG. 5. FIGS. 3 and 4 show further characteristic data relating to this example.

Example of Embodiment 2

Fullerene Layer as Electron Conducting Layer

1. Transparent glass substrate
2. ITO anode
3. Hole transport layer
4. Electron blocking layer
5. Light-emitting layer
6. Hole and exciton blocking layer
7. Fullerene layer doped with organic donor-type molecules
8. Aluminum cathode In this arrangement, the doped fullerene layer is used as an electron transport layer. When a voltage is applied (plus pole to the anode, minus pole to the cathode), the arrangement emits light through the glass substrate. The aluminum cathode may also be omitted, and the minus pole may be applied to the doped fullerene layer. This arrangement then emits light both through the glass substrate and through the opposite side of the arrangement. Moreover, the arrangement is transparent when no voltage is applied.

Example 2a

Relating to Example of Embodiment 2

Figure 7:
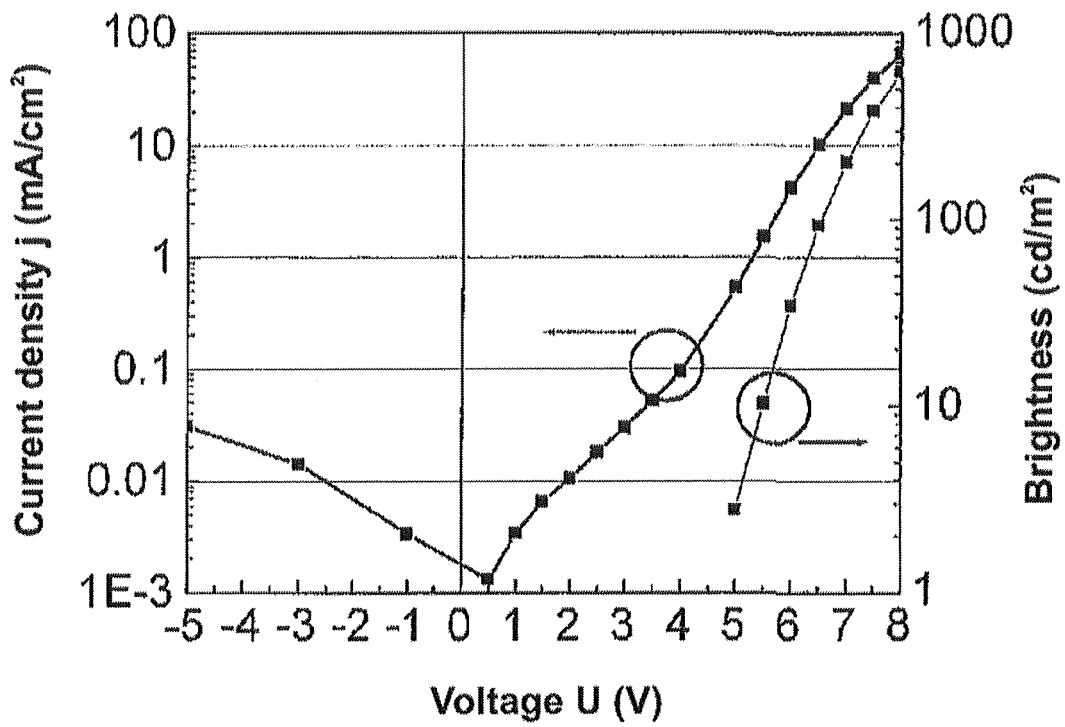
Figure 8:
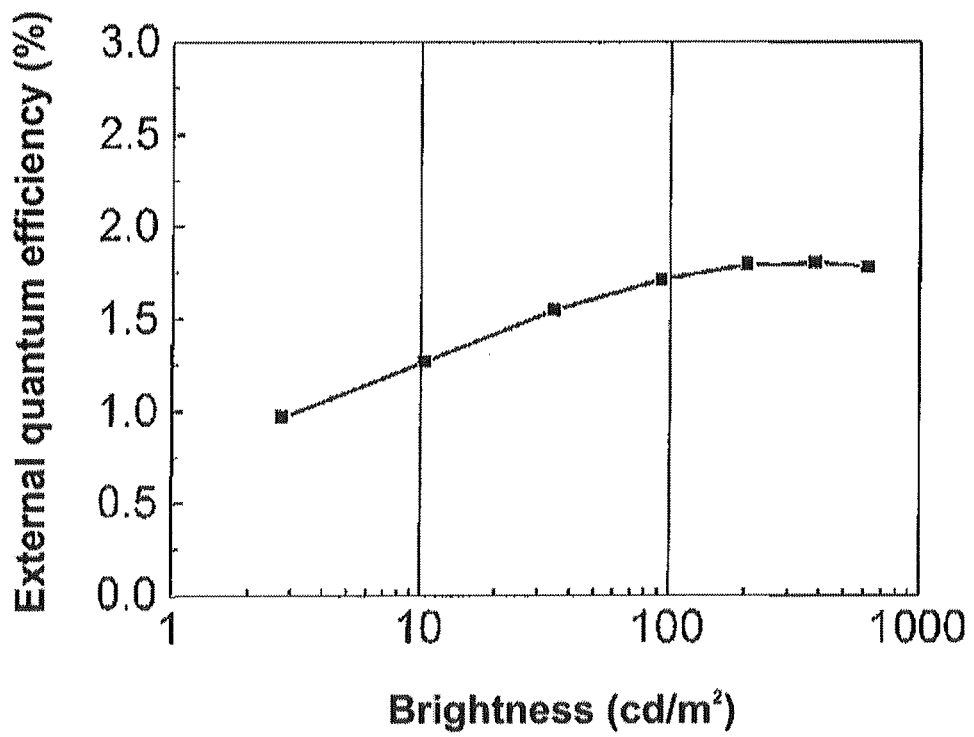

1. Transparent glass substrate
2. ITO anode
3. 60 nm MeO-TPD doped with 4 mol % $F_4$-TCNQ
4. 10 nm spiro-TAD
5. 20 nm BAlq doped with 20% by weight $Ir(piq)_3$
6. 10 nm BPhen
7. 50 nm $C_{60}$ doped with 4 mol % AOB
8. 100 nm Al In this arrangement, BPhen is formed as the hole and exciton blocking layer. At approximately 3 eV, BPhen has an electron affinity that is approximately 0.9 eV lower than that of $C_{60}$, which should manifest itself as a correspondingly high barrier to electrons. However, the arrangement according to Example 2a surprisingly exhibits very good parameters, as shown by characteristic data in FIGS. 7 and 8.

Further advantageous embodiments can be derived from examples of embodiments 1 and 2.

Example of Embodiment 3

Fullerene Layer as Electrode on Both Sides, Transparent Organic Light-Emitting Diode 1. Transparent glass substrate
2. Metal strips, spaced apart by 450 μm, width 50 μm
3. Fullerene layer doped with organic donor-type molecules
4. Hole transport layer
5. Electron blocking layer
6. Light-emitting layer
7. Hole and exciton blocking layer
8. Fullerene layer doped with organic donor-type molecules
9. Metal strips, spaced apart by 450 μm, width 50 μm Example of Embodiment 4

Stacked Organic Light-Emitting Diode, Fullerene Layer as Transparent Intermediate Electrode 1. Transparent glass substrate
2. ITO
3. First organic light-emitting diode
4. Metal strips
5. Doped fullerene layer
6. Second organic light-emitting diode
7. Aluminum cathode The stacking may of course be extended to a plurality of light-emitting diodes, with the metal strips together with the doped fullerene layer in each case acting as a transparent intermediate electrode. The individual light-emitting diodes, which may in each case emit light of different color, can be addressed separately if the intermediate electrodes are also placed at suitable potentials. This has already been demonstrated in the document U.S. Pat. No. 5,917,280, where an actuation diagram for this is also proposed. This separate addressing is beneficial both for display purposes, due to the higher pixel density that can be achieved as a result of the stacking, and for illumination purposes, due to the ability to adjust the color of the light source.

Figure 6:
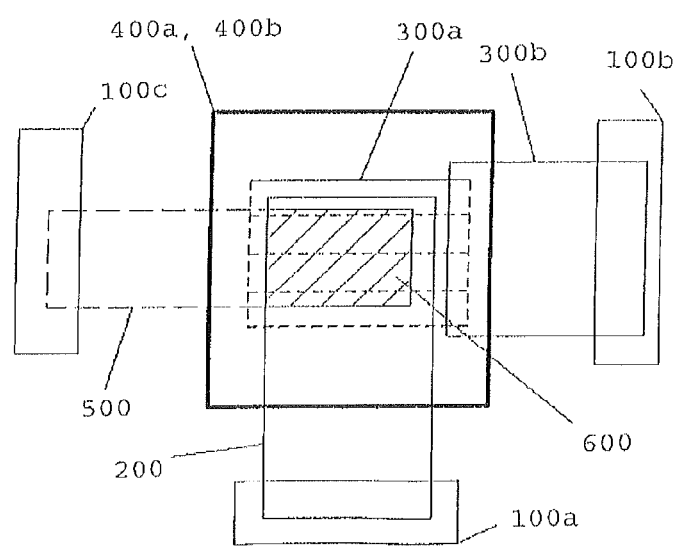
FIG. 6 shows a schematic view of an arrangement of stacked organic light-emitting diodes.

One particular challenge in this example of embodiment is the guiding of the metal strips out of the stack and the stable contacting thereof, without causing short circuits to the other electrodes. To this end, FIG. 6 shows a plan view of an arrangement which circumvents this problem by guiding intermediate electrodes out on different sides of the stack. Short-circuits between the individual electrodes are thus avoided. The following references are used here: 100a, 100b, 100c—contacts; 200—transparent anode, for example consisting of ITO; 300a—transparent intermediate electrode, consisting of metal strips and doped fullerene layer; 300b—thick metal layer for contacting the transparent intermediate electrode 300a to the contact 100b; 400a—first organic light-emitting diode; 400b—second organic light-emitting diode; 500—cathode, for example consisting of aluminum, and 600 (hatched)—overlap region of the electrodes, illuminating area.

As the number of stacked organic light-emitting diodes increases, so too does the height of the step that has to be overcome by the electrodes which are guided out, since the actual contact is usually applied directly to the substrate.

However, since the metal strips should have a thickness of only a few tens of nanometers, as the height increases so too does the risk that the strips will no longer be continuous when they pass over the step. This risk is eliminated in the arrangement shown since the metal strips pass out of the overlap region of the electrodes but do not pass beyond the underlying organic layers. A thick metal layer is then applied thereto, which overcomes the step and leads to the actual contact.

Expansion to more than two organic light-emitting diodes stacked one on top of the other is possible in that the respective intermediate electrodes to be added are guided out on different sides of the stack as explained above and are contacted. Especially for the case where more then four electrodes and intermediate electrodes are to be contacted, it may be advantageous to apply the organic layers in a polygonal shape instead of in a rectangular shape, in order to allow an edge line of the step to be overcome that is as short as possible for each electrode to be contacted.

The features disclosed in the above description, the claims and the drawings may be important both individually and in any combination for implementing the invention in its various embodiments.

The invention claimed is:

1. An electroluminescent light-emitting device comprising at least one structured metal layer and an arrangement of organic layers which are arranged on a substrate, the arrangement of organic layers comprising the following layers:
   at least one charge carrier transport layer consisting of organic material,
   at least one light-emitting layer consisting of organic material, and
   at least one doped fullerene layer which has a doping that increases the electrical conductivity;
   wherein the at least one structured metal layer is in direct contact with the at least one doped fullerene layer, and is part of an electrode that is configured to distribute a current across an area in the at least one doped fullerene layer.

2. The electroluminescent light-emitting device according to claim 1, wherein the at least one doped fullerene layer is doped with organic molecules.

3. The electroluminescent light-emitting device according to claim 1, wherein the at least one metal layer is structured by a printing process.

4. The electroluminescent light-emitting device according to claim 1, wherein the at least one doped fullerene layer is a flat electrode.

5. The electroluminescent light-emitting device according to claim 1, wherein the at least one charge carrier transport layer is the at least one doped fullerene layer.

6. The electroluminescent light-emitting device according to claim 5, wherein the at least one doped fullerene layer is an electron transport layer.

7. The electroluminescent light-emitting device according to claim 1, wherein arranged between the at least one charge carrier transport layer and the at least one light-emitting layer is a layer which has an exciton energy that is greater than an exciton energy of the at least one light-emitting layer, so that excitons from the at least one light-emitting layer are blocked by the layer arranged between the at least one charge carrier transport layer and the at least one light-emitting layer.

8. The electroluminescent light-emitting device according to claim 1, wherein the arrangement of organic layers comprises an injection layer.

9. The electroluminescent light-emitting device according to claim 8, wherein the injection layer consists of a salt of Cs or a salt of Li.

10. The electroluminescent light-emitting device according to claim 9, wherein the salt of Cs is CsF, or the salt of Li is LiF.

11. The electroluminescent light-emitting device according to claim 1, wherein the at least one charge carrier transport layer is doped.

12. The electroluminescent light-emitting device according to claim 11, wherein the at least one doped fullerene layer is in direct contact with the at least one charge carrier transport layer, wherein the at least one charge carrier transport layer comprises a host material different than fullerene.

13. The electroluminescent light-emitting device according to claim 1, wherein the electroluminescent light-emitting device comprises a vertically stacked arrangement of a plurality of organic light-emitting diodes, wherein the vertically stacked arrangement of a plurality of organic light-emitting diodes comprises at least one transparent intermediate electrode formed by the at least one doped fullerene layer.

14. The electroluminescent light-emitting device according to claim 13, wherein the at least one transparent intermediate electrode is at an electric potential that can be selected from outside.

15. The electroluminescent light-emitting device according to claim 13, comprising a plurality of transparent intermediate electrodes which are in each case guided out of a different side of the vertically stacked arrangement of organic light-emitting diodes.

16. The electroluminescent light-emitting device according to claim 1, wherein the at least one doped fullerene layer is formed by vapor co-deposition of a fullerene with a doping substance.

17. The electroluminescent light-emitting device according to claim 1, wherein the at least one doped fullerene layer is a current distribution layer which transports charge carriers from an electrode, optionally embodied as a cathode or as an anode, to regions of the at least one light-emitting layer which do not to overlap with the electrode.

18. The electroluminescent light-emitting device according to claim 17, wherein the regions of the at least one light-emitting layer which are formed so as not to overlap with the electrode are arranged at least partially below cutouts in the electrode.

19. A method for producing an electroluminescent light-emitting device, the method comprising:

forming an arrangement of organic layers comprising at least one charge carrier transport layer consisting of organic material, at least one light-emitting layer consisting of organic material, at least one doped fullerene layer which has a doping that increases the electrical conductivity;

forming at least one structured metal layer in direct contact with the at least one doped fullerene layer; and applying the arrangement of organic layers and the at least one structured metal layer to a substrate, wherein the at least one structured metal layer is part of an electrode that is configured to distribute a current across an area in the at least one doped fullerene layer.

20. The method according to claim 19, wherein the at least one doped fullerene layer is doped with organic molecules.

21. The method according to claim 19, wherein the at least one metal layer is structured by means of a printing process.

22. The method according to claim 19, wherein the method further comprises forming a flat electrode with the at least one doped fullerene layer.

23. The method according to claim 19, wherein the method further comprises forming the at least one charge carrier transport layer with the at least one doped fullerene layer.

24. The method according to claim 23, wherein the at least one doped fullerene layer is an electron transport layer.

25. The method according to claim 19, wherein the method further comprises arranging, between the at least one charge carrier transport layer and the at least one light-emitting layer, a layer which has an exciton energy that is greater than an exciton energy of the at least one light-emitting layer, so that excitons from the at least one light-emitting layer are blocked by the layer arranged between the at least one charge carrier transport layer and the at least one light-emitting layer.

26. The method according to claim 19, wherein the method further comprises forming an injection layer in the arrangement of organic layers.

27. The method according to claim 26, wherein the injection layer is formed from a salt of Cs or a salt of Li.

28. The method according to claim 27, wherein the salt is LiF or CsF.

29. The method according to claim 19, wherein the at least one charge carrier transport layer is doped, the at least one charge carrier transport being formed of a host material different than fullerene.

30. The method according to claim 19, wherein the method further comprises forming a vertically stacked arrangement of a plurality of organic light-emitting diodes, and forming at least one transparent intermediate electrode in the vertically stacked arrangement with the at least one doped fullerene layer.

31. The method according to claim 30, wherein the method further comprises forming a plurality of transparent intermediate electrodes, which are in each case guided out of a different side of the vertically stacked arrangement of organic light-emitting diodes.

32. The method according to claim 19, wherein the at least one doped fullerene layer is applied by means of vapor co-deposition of a fullerene with a doping substance.

33. The method according to claim 19, wherein the substrate, when forming the at least one doped fullerene layer, is maintained at a temperature of >30° C.

34. The method according to claim 33, wherein the substrate is maintained at a temperature of >80° C.

* * * * *